United States Patent
Alvandpour et al.

(10) Patent No.: US 6,707,708 B1
(45) Date of Patent: Mar. 16, 2004

(54) STATIC RANDOM ACCESS MEMORY WITH SYMMETRIC LEAKAGE-COMPENSATED BIT LINE

(75) Inventors: Atila Alvandpour, Beaverton, OR (US); Dinesh Somasekhar, Hillsboro, OR (US); Steven K. Hsu, Lake Oswego, OR (US); Ram K. Krishnamurthy, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/241,791

(22) Filed: Sep. 10, 2002

(51) Int. Cl.[7] ............................................... G11C 11/00
(52) U.S. Cl. ..................................... 365/154; 365/207
(58) Field of Search ................................. 365/154, 207

(56) References Cited

U.S. PATENT DOCUMENTS 4,914,629 A * 4/1990 Blake et al. ................. 365/154
5,426,614 A * 6/1995 Harward ..................... 365/225.7
6,262,911 B1 * 7/2001 Braceras et al. ............. 365/154

OTHER PUBLICATIONS

Agawa, et al., *A Bitline Leakage Compensation Scheme for Low–Voltage SRAMs*, IEEE Journal of Solid–State Circuits, vol. 36, No. 5, May 2001.

Alvandpour et al., U.S. patent application entitled: *Current Leakage Reduction for Loaded Bit–Lines in On–Chip Memory Structures*, application No. 09/896,348, filed Jun. 28, 2001.

* cited by examiner

*Primary Examiner*—Michael Tran
(74) *Attorney, Agent, or Firm*—Seth Z. Kalson

(57) ABSTRACT

An eight-cell for static random access memory, the memory cell comprising cross-coupled inverters to store the information bit, two access nMOSFETs connected to local bit lines to access the stored information bit, and two nMOS-FETs each having a gate connected to ground and coupled to the local bit lines and the cross-coupled inverters so that sub-threshold leakage currents to and from the local bit lines for a memory cell not being read are balanced.

8 Claims, 4 Drawing Sheets

US 6,707,708 B1

STATIC RANDOM ACCESS MEMORY WITH SYMMETRIC LEAKAGE-COMPENSATED BIT LINE

FIELD

Embodiments of the present invention relate to circuits, and more particularly, to static random access memory circuits.

BACKGROUND

SRAM (Static Random Access Memory) is a memory technology that finds important applications in high speed caches or register files. Such high speed memory is often integrated on a die with a microprocessor core, and may be used to store instructions, as well as data used and generated by a microprocessor. For example, a portion of a computer system is abstracted at a high level in FIG. 1. Microprocessor 102 comprises cache 104 and register files 106, which in turn comprises SRAM memory. Cache 104 may be part of a memory hierarchy to store instructions and data, where system memory 108 is part of the memory hierarchy. Communication between microprocessor 102 with memory 108 is facilitated by memory controller (or chipset) 110, which also facilitates in communicating with peripheral components 112. Microprocessor communicates directly with memory controller 110 via bus or point-to-point interconnect 114.

As process technology scales to smaller and smaller dimensions, subthreshold leakage current in transistors may present problems. For example, reading a memory cell in SRAM usually relies upon the development of a differential voltage on a pair of bit lines, where the differential voltage is indicative of the stored information bit. There are many other memory cells sharing the same pair of bit lines. During a read operation, the subthreshold leakage current in the cells not being read may cause an incorrect differential voltage to be sensed on the bit lines.

The above example is illustrated in FIG. 2. Memory cell 202 comprising cross-coupled inverters 204 and 206 is being read by asserting word line 208 HIGH (e.g., $V_{CC}$). Memory cell 202 provides a differential voltage on bit lines 210 and 212. For simplicity, only two other memory cells, illustrated in dashed lines, are shown sharing bit lines 210 and 212, but in practice there will be many more such memory cells. (Assume in the discussion that follows regarding FIG. 2 that all other memory cells sharing the bit lines have the same states as those shown in dashed lines.) Memory cell 202 has a state in which node 214 is LOW (e.g., $V_{SS}$) and node 216 is HIGH. A worst case scenario is illustrated in which those memory cells not being read are such that they store data bits in which nodes 214a and 214b are HIGH and nodes 216a and 216b are LOW. With word line 208 asserted HIGH, access nMOSFETs (n-Metal Oxide Semiconductor Field Effect Transistor) 218 and 220 are ON. With both bit lines pre-charged HIGH, bit line 210 will ideally discharge and bit line 212 will ideally maintain its HIGH state so that sense amplifier 222 will sense the correct differential voltage. However, although access nMOSFETs 218a, 218b, 220a, and 220b are OFF, there will be leakage current through them. This leakage current works against memory cell 202 discharging bit line 210, and works against memory cell 202 keeping bit line 212 HIGH. As a result, a read operation is more susceptible to noise on the bit lines causing sense amplifier 222 to provide an incorrect result.

DESCRIPTION OF EMBODIMENTS

Figure 1:
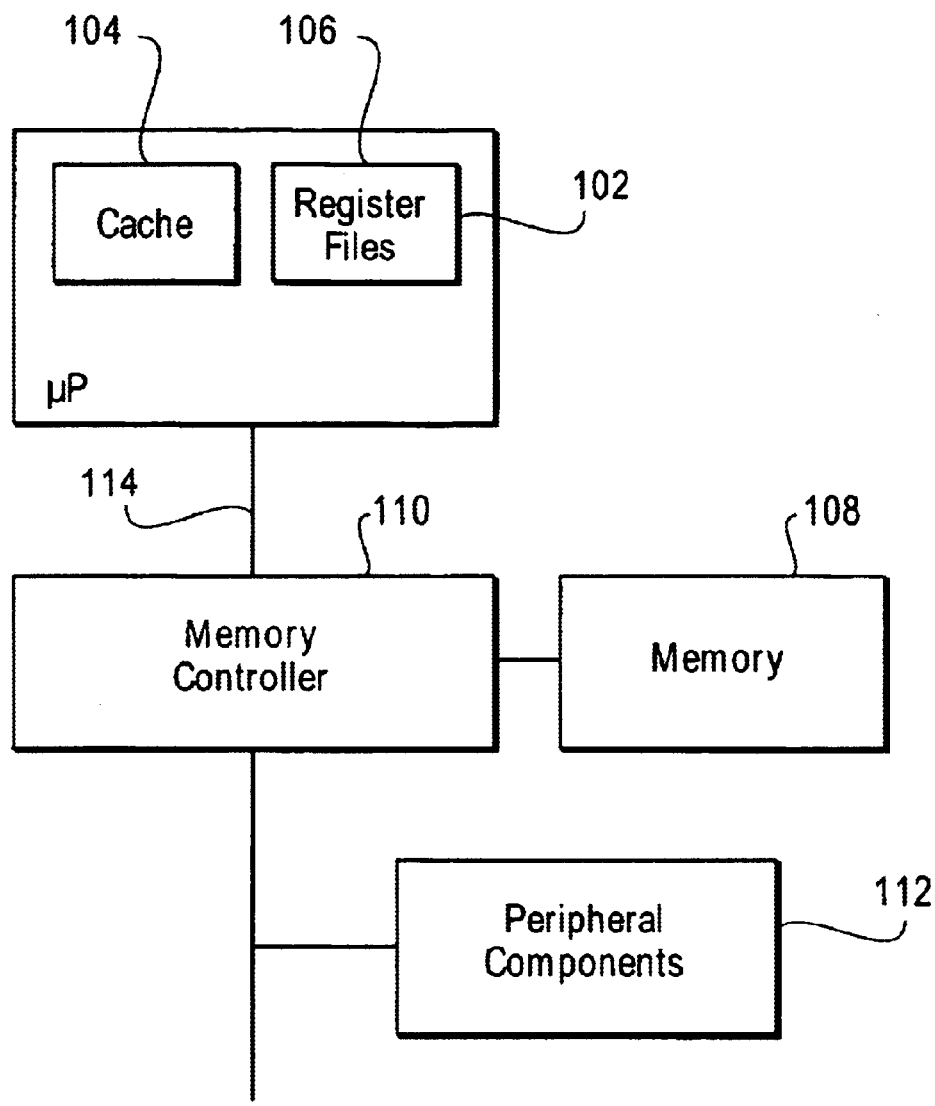
FIG. 1 illustrates at a high level a portion of a prior art computer system.
Figure 2:
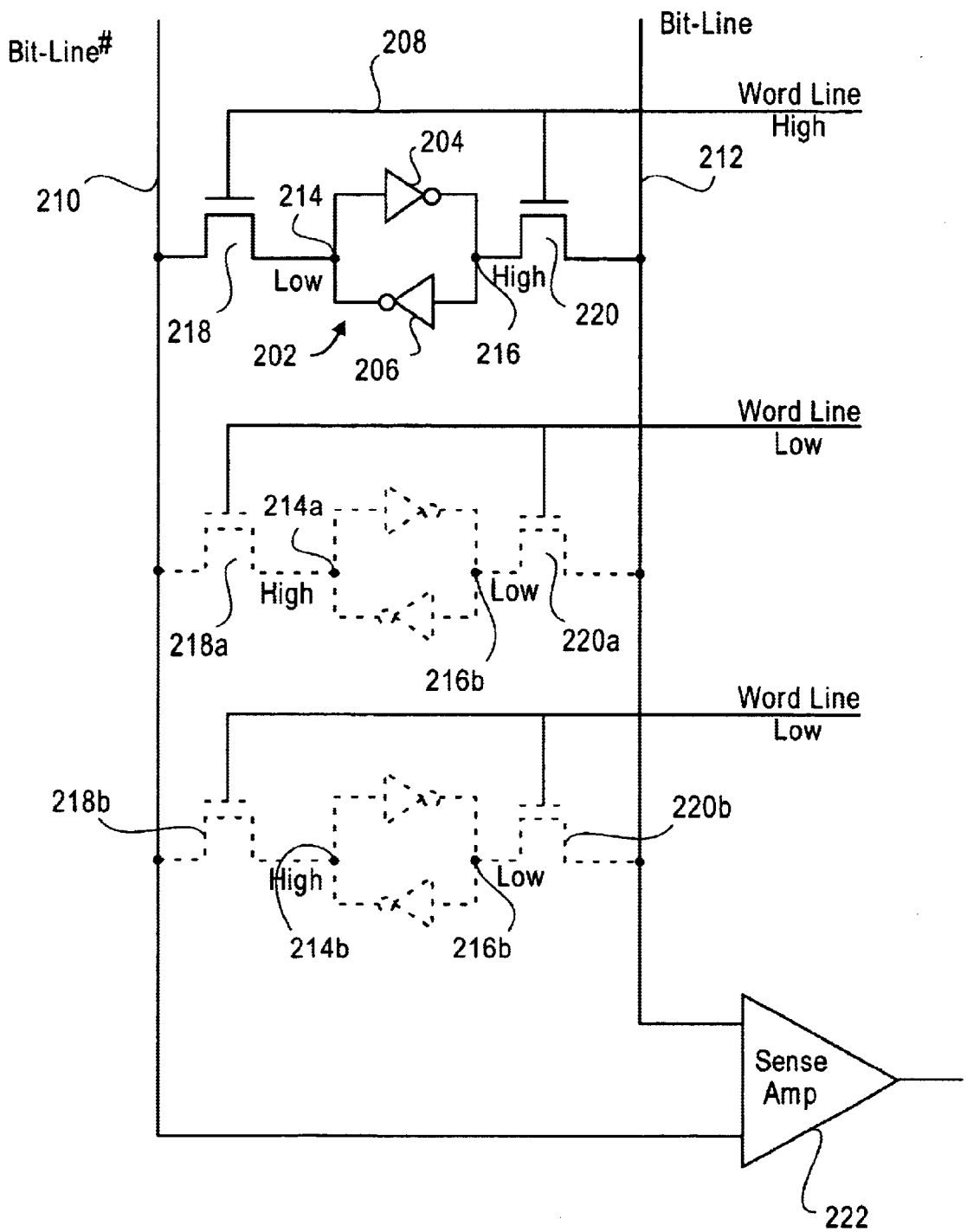
FIG. 2 illustrates a prior art SRAM.
Figure 3:
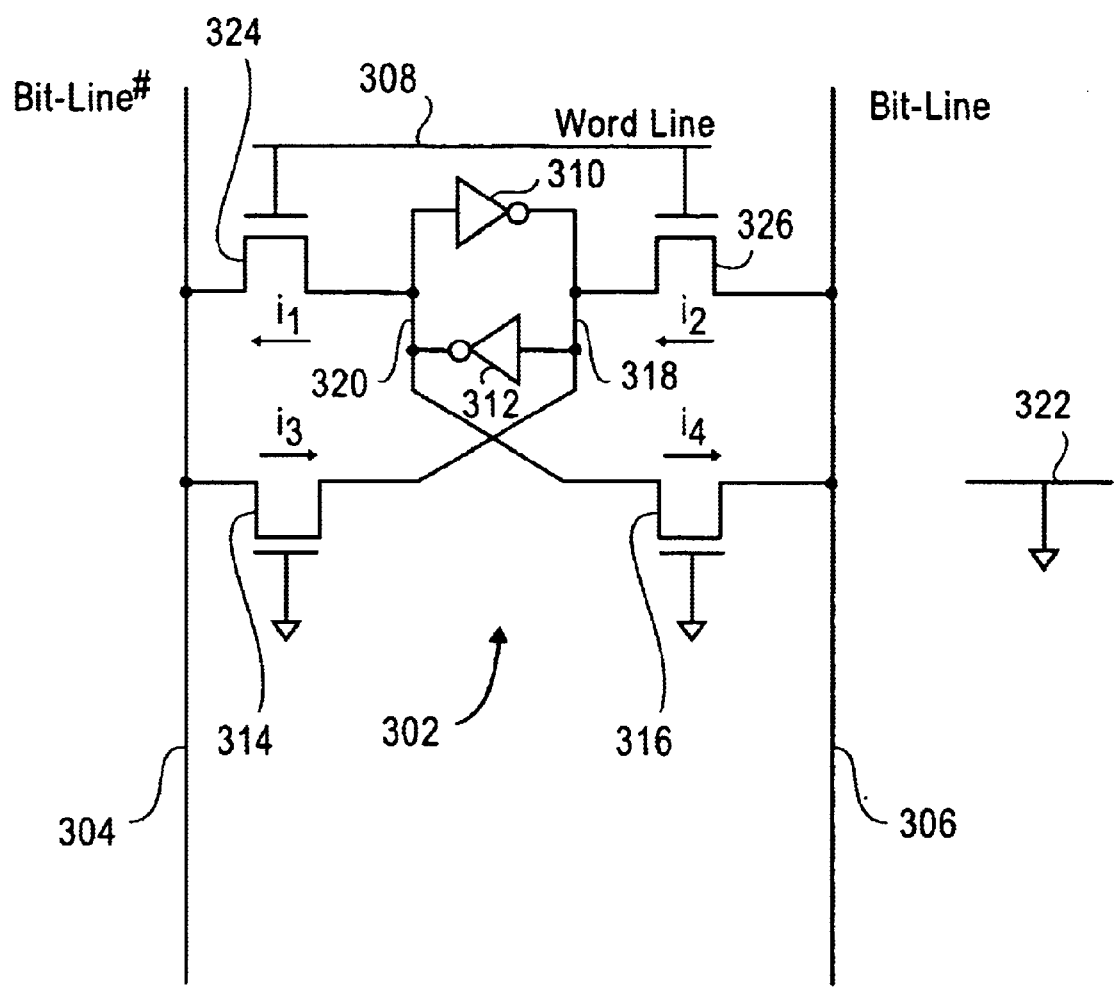
FIG. 3 illustrates a memory cell in a SRAM according to an embodiment of the present invention.

FIG. 3 shows memory cell 302 connected to bit lines 304 and 306, and accessed by word line 308. For simplicity, write ports are not shown, and only one memory cell is illustrated, but in practice many memory cells share bit lines 304 and 306. The information state is stored by cross-coupled inverters 310 and 312, and the stored information state is access by asserting word line 308 HIGH so that access nMOSFETs, 324 and 326 switch ON. nMOSFET 314 is coupled with one of its source/drain terminals connected to node 318 of cross-coupled inverters 310 and 312, and its other source/drain terminal is connected to bit line 304. nMOSFET 316 is coupled with one of its source/drain terminals connected to node 320 of cross-coupled inverters 310 and 312, and its other source/drain terminal is connected to bit line 306. The gates of both nMOSFETs 314 and 316 are connected to ground 322 ($V_{SS}$).

With the gates of nMOSFETs 314 and 316 connected to ground 322, these nMOSFETs are OFF, but subthreshold leakage current will be conducted. Subthreshold leakage current through nMOSFETs 314 and 316 are denoted respectively in FIG. 3 by $i_3$ and $i_4$ as shown. Consider the case in which memory cell 302 is not being read, so that word line 308 is LOW and access nMOSFETs 324 and 326 are OFF. Subthreshold leakage current will be conducted through nMOSFETs 324 and 326, which are respectively denoted by $i_1$ and $i_2$ as shown in FIG. 3. Suppose bit lines 304 and 306 have been pre-charged to the same voltage, $V_{CC}$. It is easily seen that each nMOSFET 314, 316, 324, and 326 has the same gate-to-source voltage. If nMOSFETs 314, 316, 324, and 326 are matched so that they have the same betas, then it follows that $i_1=i_4$ and $i_2=i_3$. Consequently, the various sub-threshold leakage currents are balanced in the sense that memory cell 302 does not contribute to a differential voltage on bit lines 304 and 306.

Although not shown, other memory cells sharing bit lines 304 and 306 are identical in structure to that of memory cell 302. Before a memory cell is read, the bit lines are pre-charged to $V_{CC}$, so that the above expressions for the subthreshold leakage currents hold for all memory cells not being read. Note that as a read operation progresses, the memory cell being read causes a differential voltage to develop on the bit lines, and thus the various sub-threshold leakage currents are only approximately balanced. But as the differential voltage develops, the sense amplifier connected to the bit lines will eventually evaluate, so that this approximation becomes less of an issue. Consequently, the differential voltage developed between a common pair of bit lines is highly insensitive to the number of memory cells sharing the bit lines, so that memory organization is simplified. Furthermore, because of the balanced subthreshold leakage currents, the memory cell of FIG. 3 may take advantage of low threshold voltage nMOSFETs as well as relatively high leaky nMOSFETs so as to speed up the differential voltage development. Consequently, it is expected that high performance SRAMs may be realized by utilizing the memory cell of FIG. 3.

Figure 4:
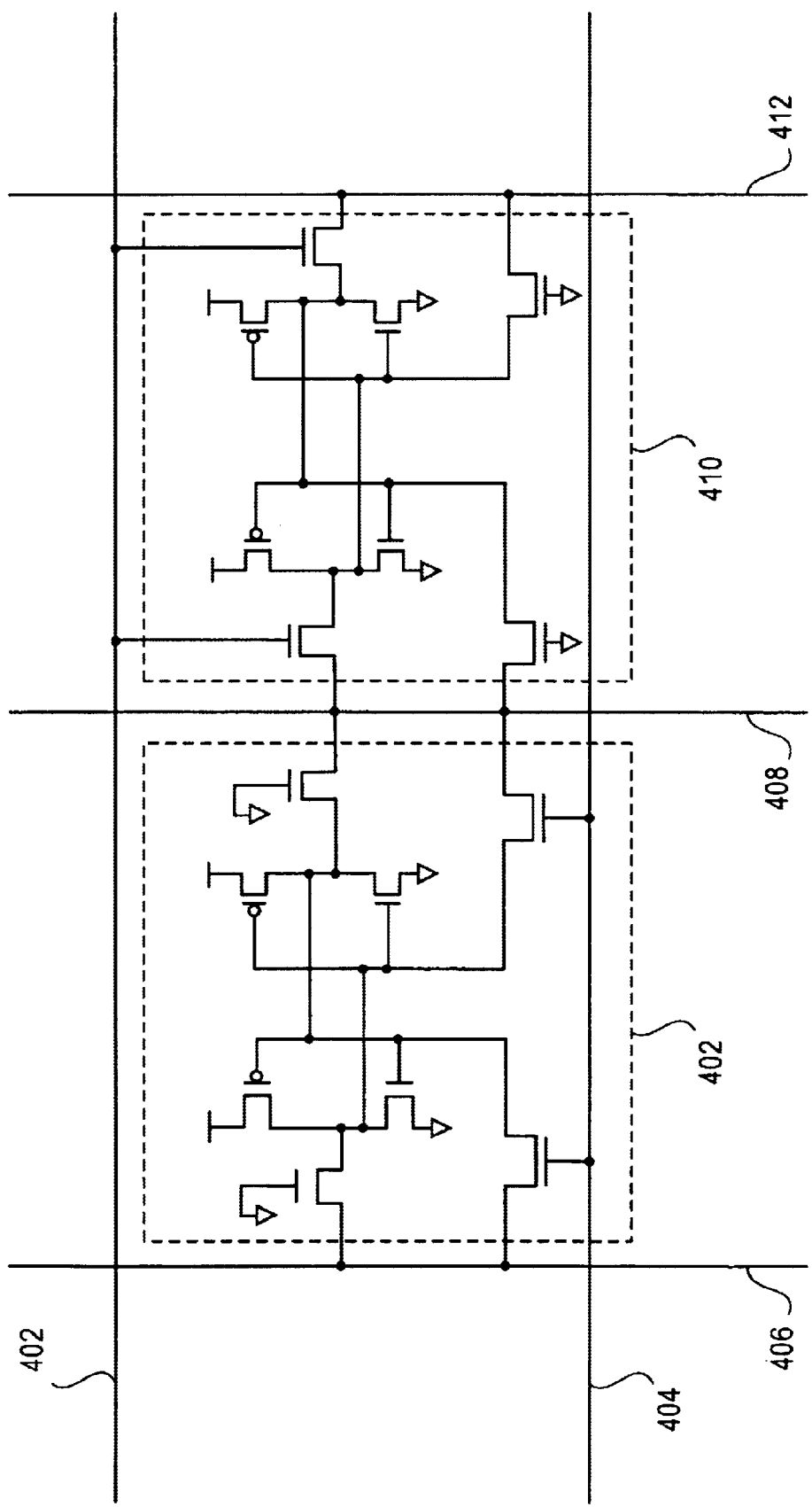
FIG. 4 illustrates memory cell layout according to an embodiment of the present invention.

In one particular embodiment, memory cells of the kind illustrated in FIG. 3 may be organized in which adjacent memory cells share a bit line. The word lines are connected to the memory cells so that no two memory cells sharing the same bit line are accessed during the same read operation. Such a memory organization is indicated in FIG. 4, where for simplicity only two memory cells are explicitly shown. In practice, a large number of memory cells would be laid out in the "x" (word line) direction and "y" (bit line) direction. As seen in FIG. 4, memory cell 402 has its access nMOSFETs connected to word line 404, and is connected to bit lines 406 and 408. The memory cell adjacent to memory cell 402 in the word line direction, memory cell 410, has its access nMOSFETs connected to word line 402, which is adjacent to word line 404, and is connected to bit lines 408 and 412. Note that bit line 408 is shared by both memory cells 402 and 410. In this way, the word line direction (x direction) of the memory cells may be reduced, so that die area is more efficiently used.

Various modifications may be made to the disclosed embodiments without departing from the scope of the invention as claimed below.

What is claimed is:

1. A memory comprising:
   a word line;
   a first bit line;
   a second bit line; and
   a memory cell comprising
      cross-coupled inverters comprising first and second nodes to store an information state represented by complementary voltages at the first and second nodes;
      a first nMOSFET comprising a gate connected to the word line and to provide a low impedance path between the first bit line and the first node only if ON;
      a second nMOSFET comprising a gate connected to the word line and to provide a low impedance path between the second bit line and the second node only if ON;
      a third nMOSFET comprising a gate connected to ground and to conduct leakage current between the second node and the first bit line; and
      a fourth nMOSFET comprising a gate connected to ground and to conduct leakage current between the first node and the second bit line.

2. The memory as set forth in claim 2, wherein the first, second, third, and fourth nMOSFETs are matched.

3. A memory comprising:
   a word line;
   a first bit line;
   a second bit line; and
   a memory cell comprising:
      a first pMOSFET comprising a gate and a drain;
      a first nMOSFET comprising a gate and a drain connected to the drain of the first pMOSFET;
      a second pMOSFET comprising a gate connected to the drain of the first pMOSFET, and a drain connected to the gates of the first pMOSFET and the first nMOSFET;
      a second nMOSFET comprising a gate connected to the gate of the second pMOSFET, and a drain connected to the drain of the second pMOSFET;
      a third nMOSFET comprising a gate connected to the word line, a first source/drain terminal connected to the drain of the first pMOSFET, and a second source/drain terminal connected to the first bit line;
      a fourth nMOSFET comprising a gate connected to the word line, a first source/drain terminal connected to the drain of the second pMOSFET, and a second source/drain terminal connected to the second bit line;
      a fifth nMOSFET comprising a gate connected to ground, a first source/drain terminal connected to the drain of the second pMOSFET, and a second source/drain terminal connected to the first bit line; and
      a six nMOSFET comprising a gate connected to ground, a first source/drain terminal connected to the drain of the first pMOSFET, and a second source/drain terminal connected to the second bit line.

4. The memory as set forth in claim 3, wherein the third, fourth, fifth, and six nMOSFETs are all matched to each other.

5. A memory comprising:
   a word line;
   a first bit line;
   a second bit line; and
   a memory cell comprising
      cross-coupled inverters comprising first and second nodes to store an information state represented by complementary voltages at the first and second nodes;
      a first nMOSFET comprising a gate connected to the word line, a first source/drain terminal connected to the first node, and a second source/drain terminal connected to the first bit line;
      a second nMOSFET comprising a gate connected to the word line, a first source/drain terminal connected to the second node, and a second source/drain terminal connected to the second bit line;
      a third nMOSFET comprising a gate connected to ground, a first source/drain terminal connected to the second node, and a second source/drain terminal connected to the first bit line; and
      a fourth nMOSFET comprising a gate connected to ground, a first source/drain terminal connected to the first node, and a second source/drain terminal connected to the second bit line.

6. The memory as set forth in claim 5, wherein the first, second, third, and fourth nMOSFETs are all matched to each other.

7. A die comprising a memory, the memory comprising:
   a set of memory cells defining a region of the die, the region of the die having a word line direction;
   a first set of word lines;
   a second set of word lines; and
   a set of bit lines;
   wherein the first and second sets of word lines are laid out substantially parallel with respect to each other over the region of the die so that each word line is along the word line direction;
   wherein the first and second word lines are laid out on the region of the die so that each word line belonging to the first set of word lines is not a closest word line to any other word line belonging to the first set of word lines, and each word line belonging to the second set of word lines is not a closest word line to any other word line belonging to the second set of word lines;
   wherein for any two memory cells adjacent with respect to each other in the word line direction, a first memory cell in the two adjacent memory cells is connected to a word line belonging to the first set of word lines, a second memory cell in the two adjacent memory cells is connected to a word line belonging to the second set of word line, and the two memory cells share a bit line belonging to the set of bit lines; and wherein the first memory cell in the two adjacent memory cells comprises:

cross-coupled inverters comprising first and second nodes to store an information state represented by complementary voltages at the first and second nodes;

a first nMOSFET comprising a gate connected to a word line belonging to the first set of word lines, a first source/drain terminal connected to the first node, and a second source/drain terminal connected to a bit line;

a second nMOSFET comprising a gate connected to the word line belonging to the first set of word lines, a first source/drain terminal connected to the second node, and a second source/drain terminal connected to the shared bit line;

a third nMOSFET comprising a gate connected to ground, a first source/drain terminal connected to the second node, and a second source/drain terminal connected to the bit line; and a fourth nMOSFET comprising a gate connected to ground, a first source/drain terminal connected to the first node, and a second source/drain terminal connected to the shared bit line.

8. A computer system comprising:

a die comprising a microprocessor; and system memory external to the die;

wherein the microprocessor comprises SRAM, the SRAM comprising:

a word line;

a first bit line;

a second bit line; and a memory cell comprising cross-coupled inverters comprising first and second nodes to store an information state represented by complementary voltages at the first and second nodes;

a first nMOSFET comprising a gate connected to the word line, a first source/drain terminal connected to the first node, and a second source/drain terminal connected to the first bit line;

a second nMOSFET comprising a gate connected to the word line, a first source/drain terminal connected to the second node, and a second source/drain terminal connected to the second bit line;

a third nMOSFET comprising a gate connected to ground, a first source/drain terminal connected to the second node, and a second source/drain terminal connected to the first bit line; and a fourth nMOSFET comprising a gate connected to ground, a first source/drain terminal connected to the first node, and a second source/drain terminal connected to the second bit line.

* * * * *